US006643418B2

(12) United States Patent
Ferling

(10) Patent No.: US 6,643,418 B2
(45) Date of Patent: Nov. 4, 2003

(54) ELECTRIC OR OPTO-ELECTRIC COMPONENT WITH A PACKAGING OF PLASTIC AND A METHOD FOR VARYING THE IMPEDANCE OF A TERMINAL LEAD OF THE COMPONENT BY ATTACHING A DIELECTRIC PLATE TO AT LEAST ONE TERMINAL LEAD

(75) Inventor: Dieter Ferling, Stuttgart (DE)

(73) Assignee: Alcatel, Paris (FR)

(*) Notice: Subject to any disclaimer, the term of this patent is extended or adjusted under 35 U.S.C. 154(b) by 94 days.

(21) Appl. No.: 09/893,690

(22) Filed: Jun. 29, 2001

(65) Prior Publication Data
US 2002/0014690 A1 Feb. 7, 2002

(30) Foreign Application Priority Data
Jun. 30, 2000 (DE) .......................... 100 31 843

(51) Int. Cl.⁷ .............................................. H01L 23/28
(52) U.S. Cl. ........................ 385/14; 257/690; 257/787
(58) Field of Search ......................... 385/14; 257/690, 257/787

(56) References Cited

U.S. PATENT DOCUMENTS

| 4,751,513 A | * | 6/1988 | Daryoush et al. ..... 343/700 MS |
| 5,485,037 A | * | 1/1996 | Marrs .......................... 257/712 |
| 2002/0003291 A1 | * | 1/2002 | Lamson et al. ............. 257/666 |
| 2002/0003294 A1 | * | 1/2002 | Bissey ........................ 257/676 |

FOREIGN PATENT DOCUMENTS

EP 0 603 158 A2 6/1994
WO WO 99/34444 7/1999

OTHER PUBLICATIONS

Patent Abstracts of Japan, vol. 1995, No. 06, Jul. 31, 1995 corresponding to JP 07 086489 (NEC Corp) dated Mar. 31, 1995.
Patent Abstracts of Japan, vol. 1996, No. 06, Jun. 28, 1996 corresponding to JP 08 051179 A (Sanyo Electric Co. Ltd.) dated Feb. 20, 1996.
Patent Abstracts of Japan, vol. 2000, No. 06 Sep. 22, 2000 corresponding to JP 2000 091491 A (Kankyo Denji Gijutsu Kenkyusho) dated Mar. 31, 2000.
Patent Abstracts of Japan, vol. 018, No. 577 (E–1625) Nov. 4, 1994 corresponding to JP 06 216309 A (Oki Electric Ind Co, Ltd.) dated Aug. 5, 1994.
Patent Abstracts of Japan, vol. 1998, Nov. 30, 1998 corresponding to JP 10 209365 A (Texas Instr Inc.) dated Aug. 7, 1998.

* cited by examiner

Primary Examiner—Lynn Feild
Assistant Examiner—Michael C. Zarroli
(74) Attorney, Agent, or Firm—Sughrue Mion, PLLC

(57) ABSTRACT

The invention relates to an electric or opto-electric component (1, 11) with a packaging (2, 12) of plastic, at least one electric or opto-electric integrated circuit (3, 13) arranged in the packaging (2, 12) and terminal leads (4, 14) protruding from the packaging (2, 12) for connection of the circuit or each circuit (3, 13). To reduce the impedance (Z) of the terminal leads (4, 14) in the simplest possible way, it is proposed that at least one dielectric plate (6, 16', 16") is attached to at least one of the terminal leads (4, 14). The dielectric plates (6, 16) are arranged preferably in the inside of the packaging (2, 12) and consist preferably of ceramic, in particular of aluminium oxide.

9 Claims, 3 Drawing Sheets

ELECTRIC OR OPTO-ELECTRIC
COMPONENT WITH A PACKAGING OF
PLASTIC AND A METHOD FOR VARYING
THE IMPEDANCE OF A TERMINAL LEAD
OF THE COMPONENT BY ATTACHING A
DIELECTRIC PLATE TO AT LEAST ONE
TERMINAL LEAD

BACKGROUND OF THE INVENTION

The invention is based on a priority application (DE 10031 843.6) which is hereby incorporated by reference. The present invention relates to an electric or opto-electric component with a packaging of plastic. Arranged in the packaging is at least one electric or opto-electric integrated circuit. Terminal leads for the connection of the circuit or of each circuit protrude from the package. The circuit or each circuit can be attached with the aid of the terminal leads by means of a base, for example, or by means of a soldered connection to a printed-circuit board and integrated into a circuit arrangement formed on the circuit board. The present invention also relates to a method for varying the impedance of a terminal lead of such an electric or opto-electric component.

Electric or opto-electric components of the type stated at the beginning are known from the prior art. The integrated circuit arranged in the packaging of such a component can be designed for a wide range of applications, for example for a storage element or a microprocessor. The arrangement and size of the terminal leads (so-called pins) of the components are largely standardized. Components of this kind are used in particular in circuit arrangements that operate relatively slowly or at a relatively low frequency. In high-speed applications with a processing speed of several Gb/s and in high-frequency applications of several GHz, the impedance must be controlled during operation, i.e. the impedance of the components of the circuit arrangement, the impedance of the printed conductors of the circuit arrangement, the impedance of the terminal leads and the impedance of the circuits must be of roughly the same magnitude. Different impedances could lead in high-speed and high-frequency applications to disruptive signal reflections in the circuits or in the circuit arrangement on the circuit board.

The impedance of the printed conductors on the circuit board, the other components arranged on the circuit board and the circuits can be set to a value that is roughly the same without any great effort. Their impedance is typically around 25 Ohms or 50 Ohms. Only the bonding connections (e.g. bonding wires) between the circuits and the terminal leads of the component, and the terminal leads themselves have a higher impedance differing from this.

To reduce disruptive signal reflections, it would be necessary to reduce the impedance of the terminal leads to the impedance of the circuit arrangement into which the component is integrated and to that of the circuits. In known components with a packaging of plastic, the impedance of the terminal leads cannot simply be varied or reduced, however, as the arrangement, size and spacing of the terminal leads relative to one another are set. In addition, reducing the impedance of the terminal leads to around 25 Ohms or 50 Ohms in known components by changing the arrangement, size or spacing of the terminal leads would only be possible, if at all, with extremely high production engineering demands. These high production engineering demands result for example from the fact that the distance between two terminal leads arranged adjacent to one another would be so small in the event of the impedance being reduced to 25 Ohms or 50 Ohms that the terminal leads would scarcely be manufacturable using conventional punching dies.

Electric or opto-electric components are known from the prior art with a packaging of ceramic or metal. In these components, the impedance of the terminal leads can be varied and reduced to the impedance of the circuit arrangement into which the component is integrated, and of the circuits. The manufacture of components with a ceramic or metal packaging is very time-consuming and expensive, however.

SUMMARY OF THE INVENTION

The object of the present invention, therefore, is to provide an option that is as simple and cheap as possible for varying, and in particular reducing, the impedance of terminal leads of an electric or opto-electric component with a packaging of plastic.

The invention achieves the above objective by utilizing a component of the type described and attaching at least one dielectric plate to at least one of the terminal leads.

If the equivalent circuit diagram of two terminal leads (so-called pins) of the component arranged immediately adjacent to one another is examined, this has inductances running in the longitudinal direction of the terminal leads and capacitances between terminal leads arranged adjacent to one another. The impedance of a terminal lead is proportional to the square root of the quotient of inductance and capacitance, i.e. the impedance of a terminal lead can be reduced by increasing the capacitance acting between two terminal leads. It is proposed according to the invention to increase the capacitance between the terminal leads by attaching at least one dielectric plate to the terminal leads. The capacitance can be varied by the choice of material and thus the dielectric constant of the dielectric plate and by varying the dimensions of the dielectric plate. The impedance of the terminal leads can be set to a desired value by a suitable choice of material and the dimensions of the dielectric plate.

It would be conceivable to attach the dielectric plates to the terminal leads outside the packaging. According to an advantageous development of the present invention, however, it is proposed that the dielectric plate or each dielectric plate is attached to the terminal lead or each terminal lead in the packaging. This prevents the dielectric plates from being inadvertently removed from the terminal leads, and the component according to the invention is easier to handle. In addition, the component according to this development can be manufactured particularly easily and cheaply, in that in the context of the production stage for production of the plastic packaging of the component, the circuit bonded to the terminal leads is encapsulated together with the dielectric plates fitting on the terminal leads in plastic.

According to a preferred form of embodiment of the present invention, it is proposed that the dielectric plate or each dielectric plate has a higher dielectric constant than the plastic of the packaging. The dielectric plate or each dielectric plate advantageously consists of ceramic, preferably of aluminium oxide ($Al_2O_3$).

According to another advantageous development of the present invention, it is proposed that the packaging is drawn laterally over the terminal leads. The terminal leads thus run inside the packaging horizontally in the first instance away from the circuit and then bend vertically downwards, to emerge finally from the packaging at the underside of the component. It is also conceivable that the terminal leads branch off once again from the vertical to the horizontal and only then emerge laterally from the packaging. In this development, it is crucial that the terminal leads run over the maximum possible area inside the packaging and are enclosed by plastic. The dielectric constant of plastic, which encloses the terminal leads over virtually their entire length, is greater than the dielectric constant of air, which in conventional components surrounds a large part of the terminal leads. The terminal leads of the component thus have a reduced impedance according to this development, even if no dielectric plates are attached to the terminal leads. The dielectric plates can be attached to the terminal leads at any point of the terminal leads, preferably inside the packaging.

To increase the capacitance between the terminal leads further, it is proposed according to a further preferred form of embodiment of the present invention that the surface of the dielectric plate or each dielectric plate facing away from the terminal leads is coated at least partly with a metal layer. According to this development, the terminal leads and the metal layer form a plate condenser to some extent with the dielectric plate arranged in between.

Two dielectric plates are advantageously attached to the terminal leads. One of the dielectric plates can be attached to the areas of the terminal leads running horizontally inside the packaging and the other dielectric plate can be attached to the areas of the terminal leads extending vertically downwards.

The use of a dielectric plate to vary the impedance of a terminal lead of an electric or opto-electric component is also proposed according to the present invention. The component has a packaging of plastic, at least one electric or opto-electric integrated circuit arranged in the packaging and several terminal leads protruding from the packaging for connection of the circuit or each circuit. To vary the impedance of the terminal lead, the dielectric plate is attached to the terminal lead.

As another way of achieving the object of the present invention, it is proposed starting out from the method of the type stated at the beginning that at least one dielectric plate is attached to at least one of the terminal leads.

BRIEF DESCRIPTION OF THE DRAWINGS

Further features, application options and advantages of the invention result from the following description of practical examples of the invention, which are shown in the drawing. In this regard, all the features described or illustrated form the object of the invention for themselves or in any combination, regardless of their summary in the claims or their reference back and regardless of their formulation or depiction in the description or the drawing. In said drawing:

DETAILED DESCRIPTION OF THE INVENTION

Figure 1:
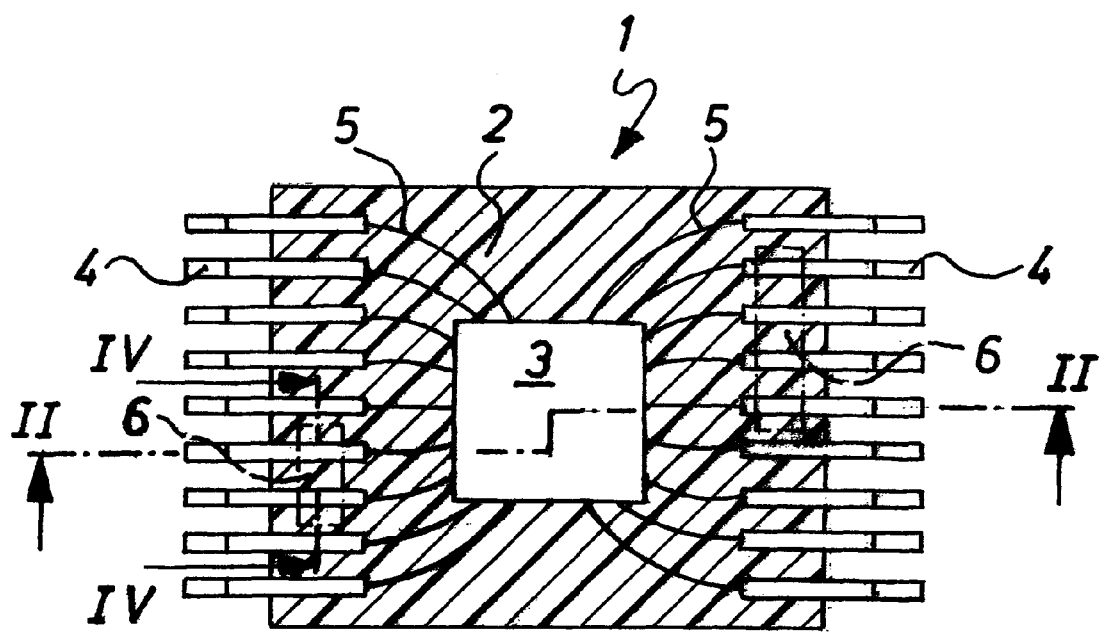
FIG. 1 shows an electric or opto-electric component according to the invention according to a first preferred form of embodiment, in a view from above, partly in section.
Figure 2:
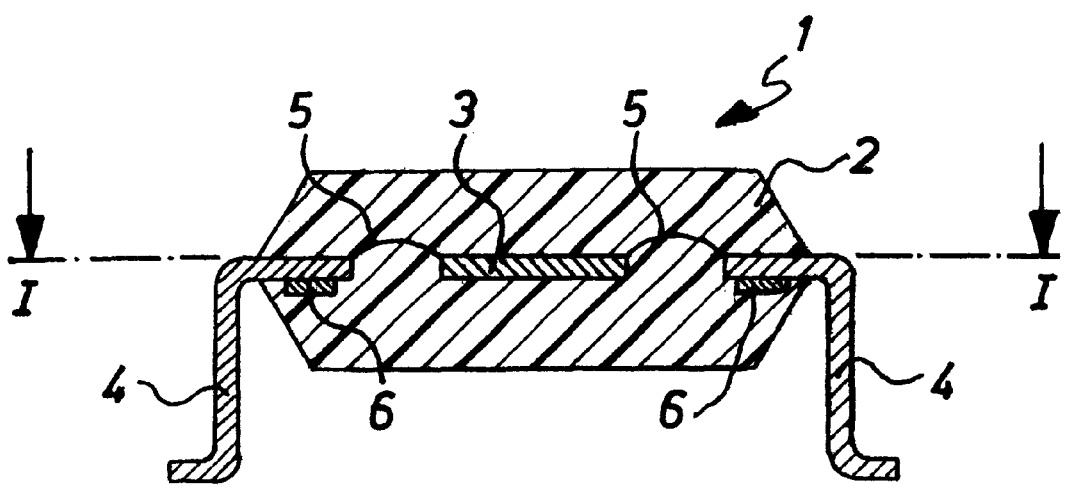
FIG. 2 shows the component according to the invention from FIG. 1 in a cross-section along Line II—II.

In FIGS. 1 and 2, an electric or opto-electric component according to a first form of embodiment of the present invention is described in its entirety by the reference symbol 1. The component 1 has a packaging 2 of plastic and an electric or opto-electric integrated circuit 3 arranged in the packaging 2. Protruding laterally from the packaging 2 are terminal leads 4, which are bonded on the one hand to terminals of the circuit 3. In the present practical example, bonding is effected by means of so-called bonding wires 5. On the other hand, the terminal leads 4 are bonded to corresponding contacts of the circuit 3. The terminal leads 4 serve to connect the circuit 3 to a circuit arrangement that is formed for example on a circuit board and into which the component 1 is to be integrated. The component 1 is attached to the circuit board for example by means of a suitable base or by means of soldered connections and bonded to the circuit arrangement.

The component 1 also has two dielectric plates 6, which are attached to at least two of the terminal leads 4. The dielectric plate 6' is attached to two and the dielectric plate 6" to four terminal leads 4. Due to the dielectric plates 6, the impedance of the terminal leads 4 to which a dielectric plate 6 is attached can be lowered. In the present practical example, the impedance can be reduced from a value that is typically over some 100 Ohms to the value of the impedance of the remaining circuit arrangement into which the component 1 is integrated, and of the circuit 3, which value is typically 25 Ohms or 50 Ohms.

Reducing the impedance of the terminal leads 4 is in particular when using the component 1 in high-speed applications with bit rates of up to several Gb/s and high-frequency applications of up to several GHz. In applications of this kind, the impedance should be controlled during operation, i.e. the impedance of the terminal leads 4 should be matched to the impedance of the circuit 3 and the overall circuit arrangement into which the component 1 is integrated. The impedance of the terminal leads 4 can be reduced with the aid of the dielectric plates 6, as will be explained in greater detail below with reference to FIGS. 3 and 4.

Figure 3:
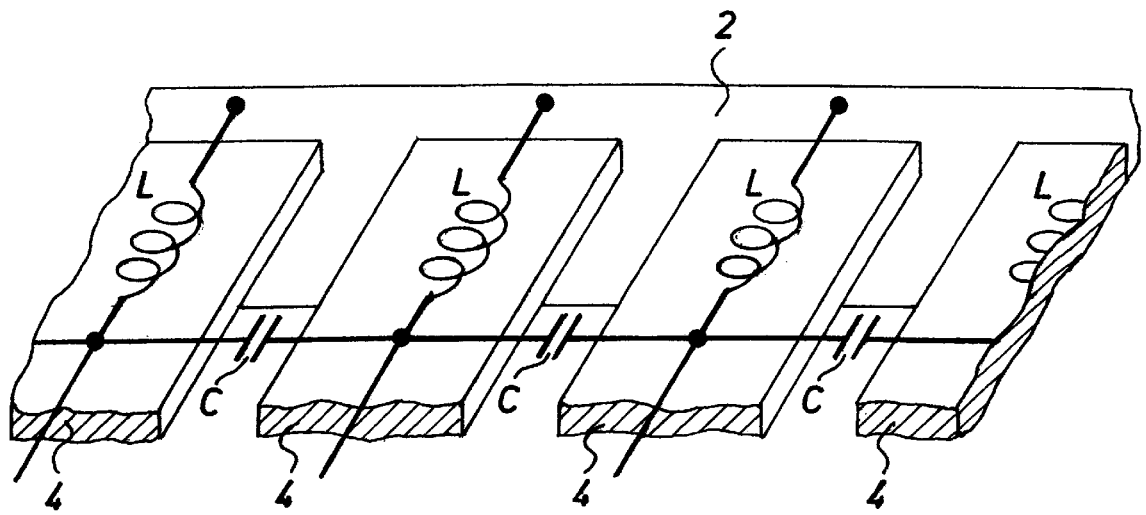
FIG. 3 shows an equivalent circuit diagram for the impedance of terminal leads of the component from FIG. 1.

FIG. 3 shows a section from the component 1 according to the invention from FIGS. 1 and 2 in perspective. The packaging 2 of plastic and several terminal leads 4 can be recognized. Superimposed on this section of the component 1 is an equivalent circuit diagram for the terminal leads 4. The equivalent circuit diagram has capacitances C between terminal leads 4 arranged adjacent to one another and inductances L along the terminal leads 4. The impedance Z of the terminal leads 4 is proportional to the root of the quotient of the inductance L and capacitance C. By increasing the capacitance C, the impedance Z of a terminal lead 4 can be reduced.

The capacitance C between two terminal leads 4 running adjacent to one another is proportional to the dielectric constant Epsilon__r of the medium existing between the two terminal leads 4. Air has a dielectric constant of roughly 1 and plastic of roughly 2.5 to 6. The dielectric constant of glass is roughly 4. In a dielectric plate 6 consisting of ceramic, preferably of aluminium oxide ($Al_2O_3$), the dielectric constant Epsilon__r is roughly 5 to 10. In special ceramic materials, the dielectric constant can reach values of up to 1000. By attaching a dielectric plate 6 to at least one terminal lead 4, the capacitance C created according to the equivalent circuit diagram between two terminal leads 4 can thus be increased markedly, leading to a reduced impedance Z of the terminal leads 4.

Figure 4:
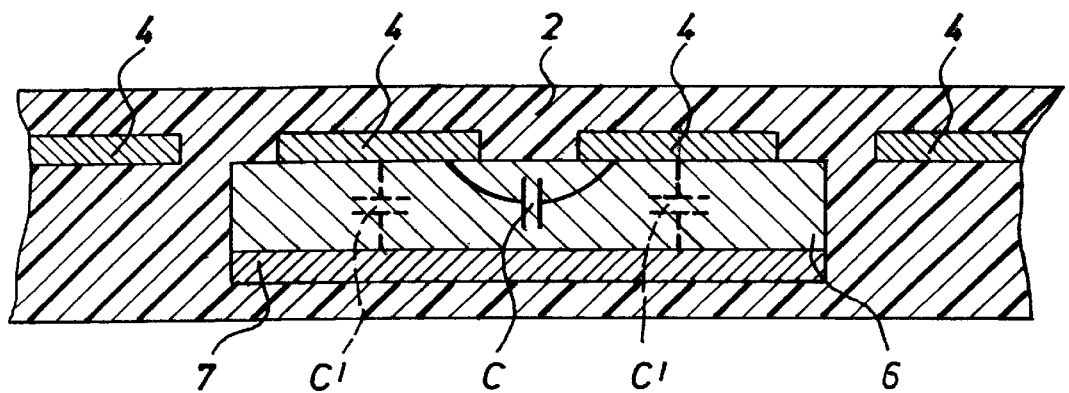
FIG. 4 shows two terminal leads of the component according to the invention from FIG. 1 in cross-section along the Line IV—IV.

The capacitance C can be markedly increased once again if a metal layer 7 is applied to the surface of the dielectric plates 6 opposite the terminal leads 4. In this case, the terminal leads 4 and the metal layer 7 act to some extent as a plate condenser. The capacitances C' of the plate condenser are shown in FIG. 4 by dashed lines.

Naturally, all terminal leads 4 of the component 1 can be provided with a dielectric plate 6, to reduce the impedance Z of all terminal leads 4. However, it makes sense to attach a dielectric plate 6 only to those terminal leads 4 of the component 1 via which signals are transmitted at a high data transmission rate (several Gb/s) or at a high frequency (several GHz). In the case of these terminal leads 4 for signal transmission, it is particularly important for the impedance to be controlled during operation, i.e. that the impedance Z of the terminal leads 4 is coordinated to the impedance of the circuit 3, the circuit arrangement into which the component 1 is integrated and the remaining components of the circuit arrangement.

Figure 5:
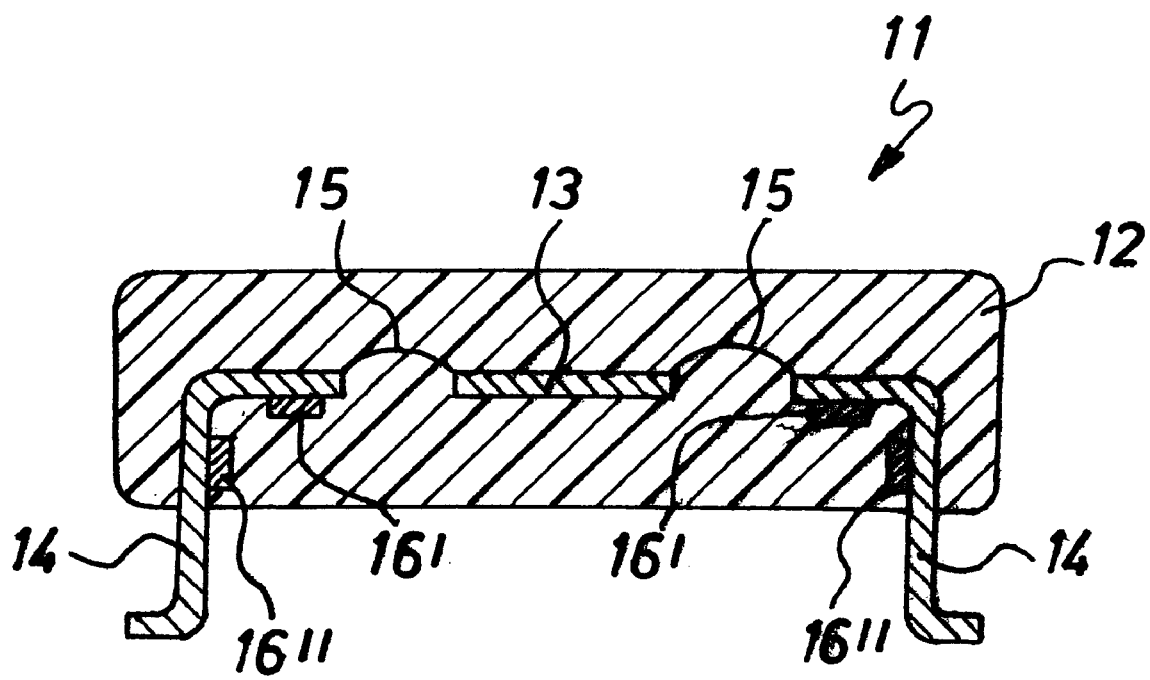
FIG. 5 shows an electric or opto-electric component according to the invention according to a second preferred form of embodiment in cross-section.

FIG. 5 shows a component 11 according to the invention according to a second preferred form of embodiment. In the component 11, a plastic packaging 12 is drawn laterally over terminal leads 14 in such a way that the terminal leads 14 emerge from the packaging 12 on the underside of the component 11. The fact alone that the terminal leads 14 are enclosed over a greater length by the plastic of the packaging 12 than in the first practical example (cf. FIG. 2) leads to a markedly higher capacitance C of the equivalent circuit diagram and thus to a markedly lower impedance Z of the terminal leads 14. Several dielectric plates—in the present practical example two, 16', 16"—can also be arranged along the terminal leads 14 and attached to these. Due to this, the impedance Z of the terminal leads 14 can be reduced to a particularly low and uniform value along the terminal leads 14.

The dielectric plates 6, 16 are brought simply to rest on the terminal leads 4, 14 during production of the packaging 2, 12 of the component 1, 11, and then fixed in this position by encapsulation in plastic. The manufacture as a whole of the component 1, 11 according to the invention can be carried out using the existing machines. Only one additional step has to be provided to arrange the dielectric plates 6, 16 on the terminal leads 4, 14. The arrangement and size of the terminal leads 4, 14 of the component 1, 11 according to the invention are identical to the components known from the prior art with a packaging of plastic. Due to this, the components 1, 11 according to the invention can easily be integrated into circuit arrangements conceived for the components that were customary hitherto. Due to the reduced impedance of the terminal leads 4, 14 in the components 1, 11 according to the invention, however, a marked reduction occurs in disruptive signal reflections in the circuit 3, 13 or in the circuit arrangement on the circuit board into which the component 1, 11 is integrated, particularly in high-speed and high-frequency applications.

What is claimed is:

1. An electric or opto-electric component comprising:
   a plastic packaging;
   at least one electric or opto-electric integrated circuit arranged in the plastic packaging;
   terminal leads protruding from the plastic packaging for connection of the circuit or each circuit; and
   at least one individual dielectric plate attached to at least one of the terminal leads, said attachment of the individual dielectric plate to said terminal leads configured to adjust the varying impedance of the terminal leads on a lead by lead basis.

2. The component according to claim 1, wherein the dielectric plate or each dielectric plate is arranged in the packaging.

3. The component according to claim 1, wherein the dielectric plate or each dielectric plate has a higher dielectric constant than the plastic of the packaging.

4. The component according to claim 3, wherein the dielectric plate or each dielectric plate consists of ceramic, preferably of aluminium oxide ($Al_2O_3$).

5. The component according to claim 1, wherein the packaging is drawn laterally over the terminal leads.

6. The component according to claim 1, wherein the surface of the dielectric plate or each dielectric plate facing away from the terminal leads is coated at least partly with a metal layer.

7. The component according to claim 1, wherein two dielectric plates are attached to the terminal leads.

8. A method for varying impedance of a terminal lead of an electric or opto-electric component using a dielectric plate, said method comprising:
   providing a component with a plastic packaging and an integrated circuit arranged in the packaging and several terminal leads protruding from the packaging for connection of the circuit; and
   attaching an individual dielectric plate to at least one of the terminal leads, said dielectric plate being configured to adjust the varying impedance of the terminal lead on a lead by lead basis.

9. A method for varying the impedance of a terminal lead of an electric or opto-electric component, said method comprising:
   arranging the opto-electric integrated circuit in a plastic package, said integrated circuit having several terminal leads protruding from the packaging for connection of the circuit; and
   attaching an individual dielectric plate to at least one of the terminal leads, said dielectric plate being configured to adjust the varying impedance of the terminal lead on a lead by lead basis.

* * * * *